United States Patent [19]

Graeme

[11] 4,356,379
[45] Oct. 26, 1982

[54] INTEGRATED HEATING ELEMENT AND METHOD FOR THERMAL TESTING AND COMPENSATION OF INTEGRATED CIRCUITS

[75] Inventor: Jerald G. Graeme, Tucson, Ariz.

[73] Assignee: Burr-Brown Research Corporation, Tucson, Ariz.

[21] Appl. No.: 153,764

[22] Filed: May 27, 1980

Related U.S. Application Data

[63] Continuation of Ser. No. 869,228, Jan. 13, 1978, abandoned.

[51] Int. Cl.³ .......................... H05B 1/00; B01J 17/00
[52] U.S. Cl. .............................. 219/209; 219/121 LJ; 219/121 LZ; 219/505; 219/210; 219/121 LM; 29/574; 29/585; 338/225 D; 29/569 R; 29/576 S
[58] Field of Search ............... 219/121 LH, 121 LJ, 219/209, 121 LZ, 121 LM, 210, 494, 501, 505; 29/571, 574, 576 S, 585, 620; 338/8, 9, 22 R, 225 D

[56] References Cited

U.S. PATENT DOCUMENTS

| 3,395,265 | 7/1968 | Weir | 219/209 |
| 3,768,157 | 10/1973 | Buie | 29/588 |
| 3,887,785 | 6/1975 | Ahlport | 219/209 |
| 3,916,508 | 11/1975 | Conzelmann et al. | 29/574 |
| 3,947,801 | 3/1976 | Bube | 219/121 LJ |
| 4,182,024 | 1/1980 | Cometta | 29/574 |

OTHER PUBLICATIONS

Graeme et al., "Operational Amplifiers Design and Applications" C 1971, pp. 59-67.

*Primary Examiner*—M. H. Paschall
*Attorney, Agent, or Firm*—Cahill, Sutton & Thomas

[57] ABSTRACT

Apparatus for compensating thermal drift of temperature sensitive circuitry in an integrated circuit by heating the temperature sensitive circuitry by applying power to a heating element in the integrated circuit, testing the temperature sensitive circuitry, and trimming a thin film resistor in accordance with the testing results. The heating element is an integrated resistor adjacent to or surrounding the temperature sensitive circuitry. The integrated circuit further includes a thin film compensating resistor which affects or determines the degree of temperature sensitivity of the temperature sensitive circuitry. As the temperature of the temperature sensitive circuitry is increased, testing apparatus is utilized to measure a temperature sensitive parameter of the temperature sensitive circuitry. Control signals indicative of the amount of required trimming of the thin film compensation resistor are produced in response to the testing to adequately compensate the thermal drift of the temperature sensitive circuitry. The control signals are utilized to control the operations of a laser which precisely trims the thin film compensating resistor by the required amount.

7 Claims, 10 Drawing Figures

INTEGRATED HEATING ELEMENT AND METHOD FOR THERMAL TESTING AND COMPENSATION OF INTEGRATED CIRCUITS

This is a continuation of application, Ser. No. 869,228 abandoned, filed Jan. 13, 1978.

BACKGROUND OF THE INVENTION

1. Field of the Invention

The invention relates to an integrated circuit having integral heating elements, temperature sensitive circuitry and thin film resistors therein, and also to methods and apparatus for compensating thermal drift of such integrated circuits.

2. Description of the Prior Art

Thermal sensitivity, in the form of thermal drift of various electrical parameters, is a major limitation to electronic circuit performance. During integrated circuit manufacturing operations, individual units must frequently be rejected because thermal drift of one or more electrical parameters exceeds specifications. However, many types of electronic circuits are manufactured with adjustable elements, such as thin film resistors, which may be laser "trimmed" to compensate thermal drift of temperature sensitive circuitry. An example of temperature sensitive circuitry which may be compensated for thermal drift by trimming of resistors is a differential amplifier. Thermal drift of the input offset voltage of a differential amplifier occurs if the input transistors are not perfectly matched, but the thermal drift may be compensated by trimming the collector and emitter resistors of the differential amplifier. Other types of circuits in which thermal drift may be compensated by trimming resistors include voltage and current regulators used as reference elements in digital-to-analog converters, analog multipliers, voltage-to-frequency converters, any many types of AC and DC amplifiers. For a more detailed discussion of the analysis and compensation of thermal drift in semiconductor circuits, see "Operational Amplifiers-Design and Application", McGraw Hill Book Co., 1971, edited by Tobey, Huelsman, and myself.

Trimming of thin film resistors to compensate thermal drift of temperature-sensitive parameters has, up to now, involved individual measurements of packaged semiconductor circuits mounted and electrically tested in temperature controlled chambers, referred to as "ovens". The circuits are packaged, rather than in wafer form, as they may be mounted in sockets in the oven. This is necessary so that electrical contact can be made for powering and testing the circuit. The packages are of a type having an open cavity to expose the semiconductor chip to the laser beam during laser trimming to compensate the thermal drift; after the laser trimming operation a lid is mounted on the package. The measured data must be stored for later utilization in conjunction with the trimming operation. After the temperature sensitive parameter is measured over a suitable range of temperatures, the circuits are removed from the oven. Ordinarily a cooling period must be allowed. The devices under test are then mounted in a socket such that the thin film compensation resistors may be controllably positioned in the path of the laser beam. Trimming of the thin film compensation resistor then occurs as the relative positions of the laser beam and the thin film compensation resistor are precisely varied either manually or in response to computer generated control signals produced in response to the above-mentioned stored measured data. Once the proper trimming is achieved, reinsertion of the integrated circuit in the oven and thermal testing confirming the compensation of the thermal drift are required.

The above-described thermal testing, laser trimming, and retesting operations represent a very significant product expense that limts the economies otherwise realizable in the hybrid and monolithic integrated circuit technology. The costs of the ovens, sockets and personality boards for various packages, the cost of storing the measured data while the circuits under test are being transferred to the laser trimming apparatus, the costs and loss of time involved in the necessary manual handling, plugging and unplugging of devices from the sockets of the oven and laser trimming apparatus, and the time required for thermal stabilization at each temperature in the oven before each measurement of the temperature sensitive parameter, all represent costs that could be avoided if compensation for thermal drift could be accomplished while the circuits are still in wafer form. (An integrated circuit is referred to herein as being in "wafer form" if the integrated circuit, i.e., the integrated circuit die or "chip" is still part of a semiconductor "wafer" which includes a large number of unseparated identical integrated circuit dice.)

The general state of the art is indicated in IBM Technical Disclosure Bulletin, Volume 14, No. 6, November 1971, Page 1770, and U.S. Pat. Nos. 3,614,480; 3,842,346; 3,936,789; 3,703,651; 3,465,427; 3,395,265; 3,369,207; 3,289,046; 3,039,604; and 2,743,420.

SUMMARY OF THE INVENTION

Accordingly, it is an object of the invention to provide an integrated circuit which is capable of being compensated for thermal drift of an electrical parameter without the use of a thermal chamber.

It is another object of the invention to provide an integrated circuit which is capable of being compensated for thermal drift of a temperature sensitive parameter while the integrated circuit is in wafer form.

It is another object of the invention to decrease the cost of compensating thermal drift of an electrical parameter.

It is another object of the invention to provide a method and apparatus for laser trimming of resistors of an integrated circuit in response to temperature variations of an electrical parameter of the integrated circuit induced by heating the integrated circuit by means of an integral heater element.

It is another method of the invention to provide a means for controlling the temperature produced by an integral power dissipation in a heating element in an integrated circuit.

Briefly described, and in accord with one embodiment thereof, the invention includes temperature sensitive circuitry, a trimmable element which affects an electrical parameter of the temperature sensitive circuitry, and an integral heater located sufficiently closely to the temperature sensitive circuitry to heat it to rapidly a predetermined temperature. The trimmable element is a thin film resistor in a monolithic embodiment of the invention, but may be a thick film resistor in a hybrid integrated circuit embodiment of the invention. The heater element is a diffused or implanted resistor surrounding the temperature sensitive circuitry in monolithic embodiments of the invention, and is a thick film resistor surrounding the temperature sensitive circuitry in a hybrid integrated circuit embodiment of the invention.

Power is applied to the heater element to increase the temperature of the temperature sensitive circuitry to a predetermined level. The predetermined temperature is determined by controlling the amount of current induced in the heater element. In one embodiment of the invention, a separate temperature monitoring element is located with the temperature sensitive circuitry to produce a temperature monitoring signal indicative of the temperature of the temperature sensitive circuitry. The temperature monitoring signal is utilized to produce a negative feedback signal to a circuit controlling the amount of current induced in the heating element, thereby stabilizing the temperature of the temperature sensitive circuitry at the predetermined level. The temperature sensitive electrical parameter is measured by means of a sensing circuit and is compared with a reference value to produce a comparison signal representative of the amount of required trimming of the trimmable element in order to properly compensate the temperature sensitive circuitry for thermal drift of the temperature sensitive parameter. In one embodiment of the invention, the amount of trimming is determined by a processor, which determines the thermal drift from a plurality of measurements of the temperature sensitive parameter as the temperature sensitive circuitry warms up and also stored information which represents the rate of change of temperature with respect to time appliable to the device under test when it is in thermal contact with the testing and trimming apparatus. In another embodiment of the invention one or more fuseable links are provided as taps to a compensating element; one or more of the conductive links are cut by a laser beam or are "blown" by current pulsing in response to the comparison signals to adjust the value of the compensating element and thereby compensate the temperature sensitive circuitry for thermal drift of the temperature sensitive parameter.

DESCRIPTION OF THE INVENTION

Figure 1:
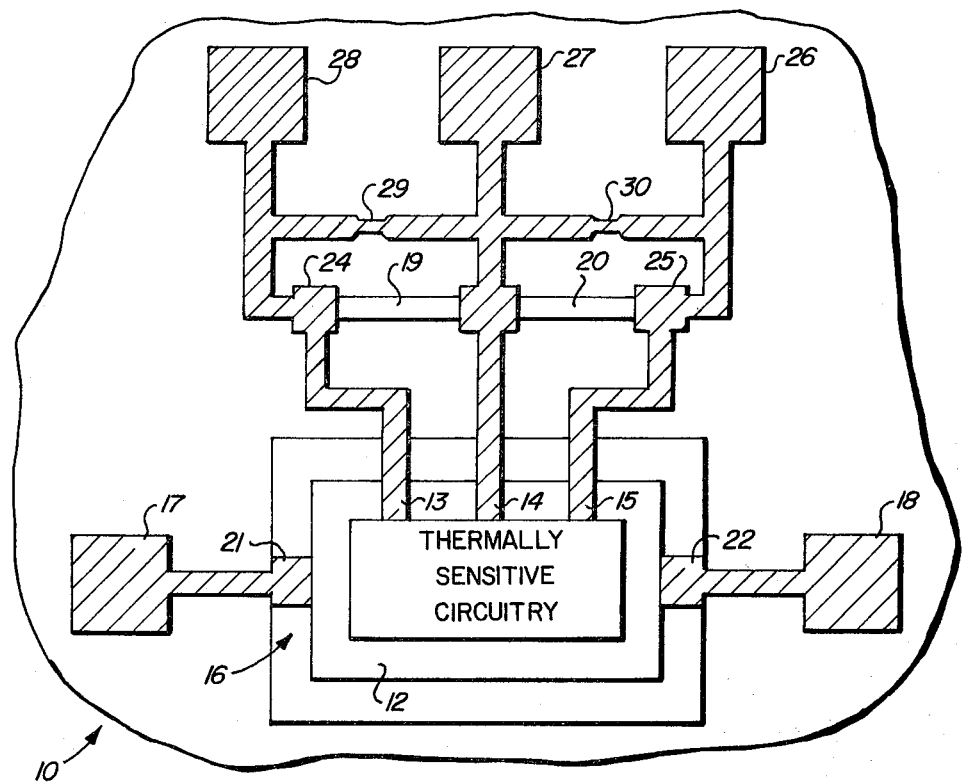
FIG. 1 shows a plan view of a portion of the surface of a monolithic integrated circuit including temperature sensitive circuitry and an integral resistive heating element.

Referring to FIG. 1, a section 10 of an integrated circuit includes thermally sensitive circuitry 12. Thermally sensitive circuitry 12 is connected to bonding pads 28, 27, and 26 by means of conductors 13, 14, and 15, respectively. Compensating element 19 is connected between conductors 13 and 14. Compensating element 20 is connected between conductors 14 and 15. Fusible link 29 connects conductors 13 and 14, and fusible link 30 connects conductors 14 and 15.

Compensating elements 19 and 20 are thin film resistors, and may be composed of nichrome. Nichrome thin film resistors are useful in implementing the invention, because they may be readily trimmed by commercially available laser trimming machines, as explained hereinafter.

Metal conductors 13, 14, and 15 are preferably formed from aluminum. Fusible links 29 and 30 are merely relatively narrow sections of aluminum metalization connected between conductors 13 and 14. Such fusible links may be "blown" or melted by sudden discharge of a quantity of charge stored on a large capacitor connected between the appropriate bonding pads.

The "blowing" of the fusible links or the laser trimming of the nichrome resistors may be performed in order to modify the operation of thermally sensitive circuitry 12 so as to compensate for thermal drift of a temperature sensitive electrical parameter thereof. In order to conveniently accomplish such compensation, integral heating element 16 is provided in the integrated circuits surrounding thermally sensitive circuitry 12. Power is applied to heating element 16 by means of bonding pads 17 and 18, which contact element 16 at locations 21 and 22, respectively. Power is applied to thermally sensitive circuitry 12, by means of voltages applied to the appropriate bonding pads or to other connections (not shown) to thermally sensitive circuitry 12. When a sufficient amount of power has been applied to bonding pads 17 and 18 to cause heating element 16 to heat thermally sensitive circuitry 12 (but not, of course, the remaining portions of the integrated circuits of the semiconductor wafer containing the integrated circuit in which temperature sensitive circuitry 12 is contained) to a predetermined temperature, the temperature sensitive parameter is tested by electrically contacting the appropriate bonding pad and measuring the temperature sensitive electrical parameter. It should be noted that the temperature sensitive parameter is measured before thermal equilibrium is established in the integrated circuit (or a larger semiconductor wafer which includes the integrated circuit). Enough power is applied to the resistive heating means to cause the temperature sensitive circuitry to rise to the predetermined temperature in an amount of time which is substantially less than the amount of time which would be required for thermal equilibrium to be established in remaining portions of the integrated circuit or the wafer containing the integrated circuit. This measured temperature sensitive parameter is compared with a reference. The comparison information is then utilized to make the necessary adjustments, either by blowing one or more of the fuseable links or by trimming one or more of the compensating resistors to reduce the thermal drift of the temperature sensitive parameter.

Figure 2A:
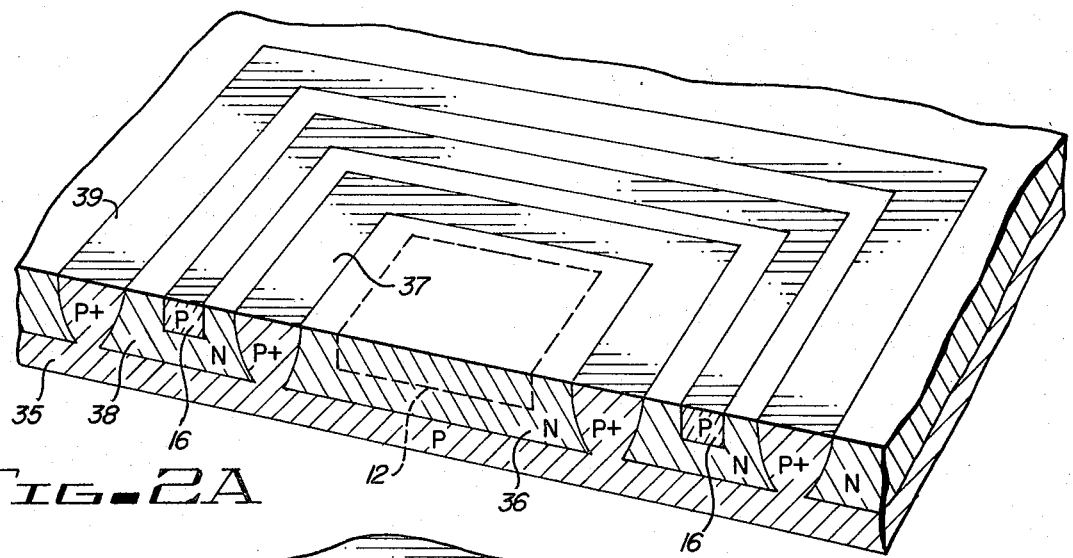
FIGS. 2A and 2B show sectional views of alternate embodiments of the heating element of FIG. 1.
Figure 2B:
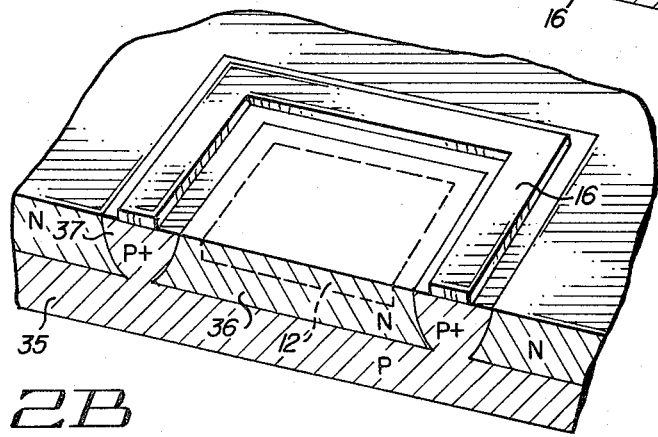

FIGS. 2A and 2B illustrate alternative structures for implementing heating element 16. Referring to FIG. 2A, thermally sensitive circuitry 12 is generally located in the region indicated by the dotted line, and may of course, include transistors, resistors, etc., arranged in conventional integrated circuit configuration and properly isolated by means of P+ isolation regions (not shown). N-type region 36, at which thermally sensitive circuitry 12 is located, is surrounded by P+ isolation region 37. N-type region 38 is isolated by concentric P+ regions 37 and 39. Heating element 16 consists of a closed P-type region in N-type region 38 and spaced from P+ region 37. Power is applied to heating element 16 in the same manner as indicated in FIG. 1, although the contacting regions 21 and 22 are not shown in FIG. 2A.

Referring now to FIG. 2B, in an alternative structure P+ region 37 surrounds N-type region 36, wherein thermally sensitive circuitry 12 is located. However, heating element 16 is implemented in this case by means of a thin nichrome film resistor disposed on P+ isolation region 37 surrounding thermally sensitive circuitry 12. The structure of FIG. 2B requires less surface area of the integrated circuit structure than the structure of FIG. 2A.

The heating element structures of both FIGS. 2A and 2B are compatible with conventional integrated circuit manufacturing techniques. The P-type region forming heating element 16 in FIG. 2A may be formed during formation of the base region. The thin film heating element 16 in FIG. 2B may be formed during formation of thin film resistors of many analog integrated circuit structures.

Thermally sensitive circuitry 12 may be any type of circuitry having a parameter which varies sufficiently with temperature to cause design problems in utilizing the thermally sensitive circuitry. Most kinds of semiconductor circuitry exhibit some degree of temperature sensitivity, thermal drift, with respect to one or more of their electrical parameters. For more comprehensive discussion of thermal drift as it effects various types of circuits, see the above-mentioned text "Operational Amplifiers-Design and Applications".

Figure 3A:
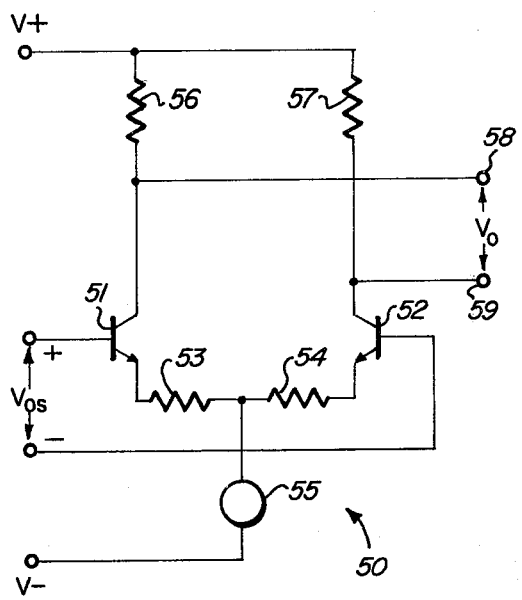
FIGS. 3A and 3B show schematic diagrams of differential amplifiers which are useful in explaining how the invention is practiced.

FIGS. 3A, 3B, 4A, and 4B show commonly used thermally sensitive circuitry wherein the thermal drift of an electrical parameter may be readily "compensated" by "trimming" or adjusting of the resistance of certain resistors to reduce or eliminate the variation of the electrical parameter with respect to temperature. FIG. 3A shows a common differential stage often used in analog circuits. Ideally, NPN input transistor 51 and 52 should be perfectly matched transistors. If they are perfectly matched, there will be no thermal drift of the output voltage $V_O$. However, if the input transistors 51 and 52 are mismatched, the circuit exhibits thermal drift of $V_O$, which thermal drift is directly related to the degree of such mismatch. It is well known that for a differential amplifier stage the effect of mismatched input transistors may be compensated by proper adjustment of one of the emitter resistors 53 and 54 and one of the collector resistors 56 and 57. The input offset voltage ($V_{OS}$) may be compensated by trimming of one of the load resistors 56 and 57, and the thermal drift of $V_O$ may be compensated by adjusting one of the emitter resistors 53 and 54. In an integrated circuit implementation of the circuit of FIG. 3A the degree of mismatching of input transistors 51 and 52 and the degree of variation in the resistances of the resistors 53, 54, 56, and 57 due to normal integrated circuit manufacturing tolerances may result in unacceptable input offset voltage and thermal drift. According to the invention, resistors 53, 54, 56, and 57 are thin film resistors. Suitable operating voltage are applied to the differential circuit of FIG. 3A, and a predetermined voltage is applied to the heating element 16 (FIG. 1). The output voltage $V_O$ is monitored or measured at a plurality of temperatures. This information is utilized by a computer or an operator to automatically or manually control a laser trimming apparatus. The laser trimming apparatus trims emitter resistor 53 or 54 by an amount sufficient to produce the desired compensation for thermal drift of $V_O$. Typically, the output voltage is measured at three different temperatures. Empirical data relating to the amount of required trimming of resistor 53 or 54 is then consulted by the laser operator to determine the amount of trimming required to compensate for thermal drift; if a computer controlled laser apparatus is utilized, the empirical data is stored in the computer memory and is used by the computer to produce the laser control signals required to accomplish the desired trimming.

Figure 3B:
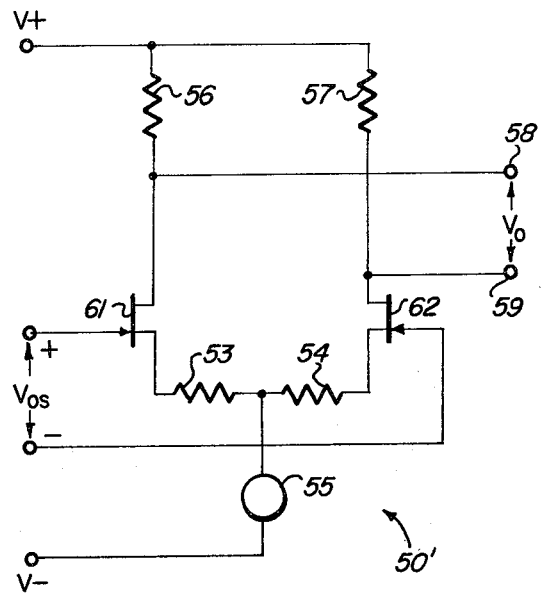

FIG. 3B shows another common differential stage which is identical to that of FIG. 3A, except that bipolar transistors 51 and 52 are replaced by junction field effect transistors 61 and 62. The same technique is used to compensate the circuit of FIG. 3B for thermal drift of $V_O$ as for the circuit of 3A.

Figure 4A:
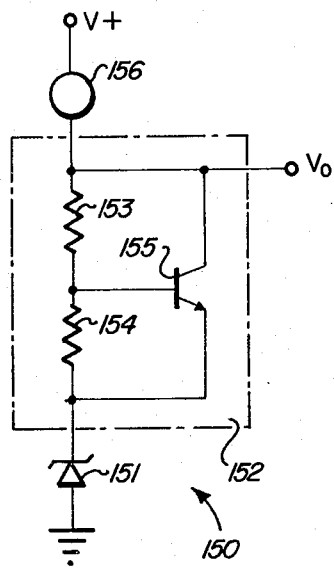
FIGS. 4A, 4B, and 4C show schematic diagrams of circuits which are useful in explaining how the invention is practiced.
Figure 4C:
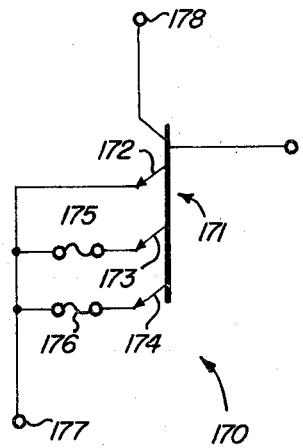
Figure 4B:
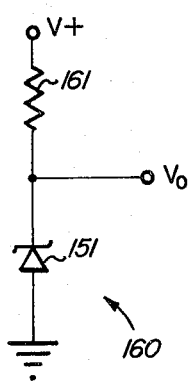

FIGS. 4A and 4B show other commonly utilized circuits which may be readily compensated for thermal drift by laser turning of thin film resistors. FIG. 4A discloses a voltage regulator including a zener diode 151, which has a positive temperature coefficient and a "$V_{BE}$" multiplier circuit 152. The temperature coefficient of "$V_{BE}$" multiplier circuit 152 may be adjusted to produce a negative temperature coefficient which counteracts the positive temperature coefficient of zener diode 151. This may be accomplished by laser trimming one or both of resistors 153 and 154. FIG. 4B shows a very simple voltage regulator circuit, wherein the temperature coefficient of the output voltage is compensated by adjusting the current through the zener diode by laser trimming resistor 161. This approach works because the temperature coefficient of integrated circuit zener diodes is a function of current density therein.

Although many temperature sensitive circuits are compensated by trimming thin film resistors, it is also possible to compensate certain circuits by blowing fusible links, such as the ones shown in FIG. 1, to disconnect circuit elements, such as diffused resistors, transistors, diodes, integrated circuit capacitors, etc., thereby modifying the thermal drift temperature sensitive parameters of the circuit. The fusible link approach to compensation of thermal drift has the disadvantage that a bonding pad must be connected to each end of the fusible link; this requires a substantial amount of chip area which could otherwise be used for active circuitry. Nevertheless, in certain applications the benefits of this technique may outweigh its disadvantages.

FIG. 4C discloses a multiple emitter transistor 171 wherein two of the emitters, 173 and 174, are connected by fusible links 175 and 176, respectively, to emitter 172. The emitter areas of the three emitters could be "scaled" so that adjustment of the current density in transistor 171 could be accomplished by "blowing" one or more of the fusible links. Additional precision could be obtained by providing more approximately scaled emitters connected by fusible links in the manner shown. Transistor 171 could conceivably be utilized as an input transistor in the differential stage of FIG. 3A.

Figure 5:
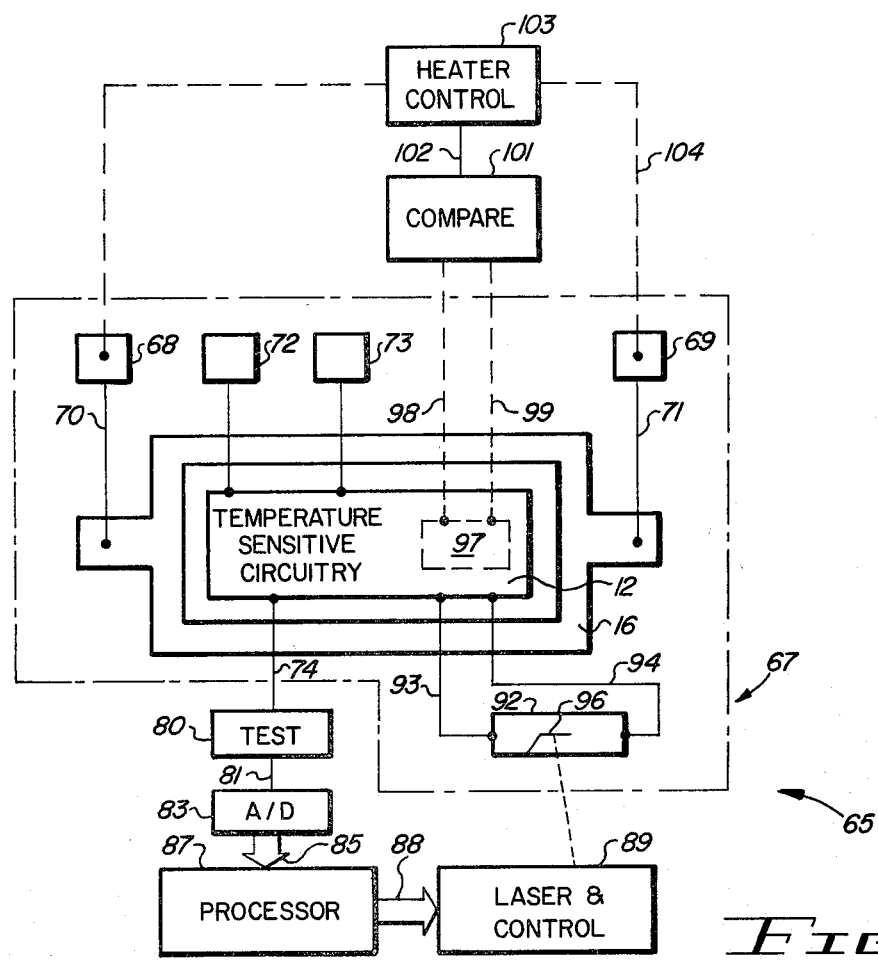
FIG. 5 shows a schematic diagram of a monolithic integrated circuit having a thin film resistive heating element surrounding temperature sensitive circuitry and apparatus for testing and trimming the thin film.

FIG. 5 shows a schematic diagram of an apparatus of one embodiment of the invention. Referring to FIG. 5, monolithic integrated circuit 67 includes temperature sensitive circuitry 12 surrounded by heating element 16. It should be noted that temperature sensitive circuitry 12, may include any of the temperature sensitive circuits discussed above or in the above-mentioned textbook on operational amplifiers, or any other circuit in which unacceptable drift of a electrical parameter occurs.

Typical examples include current or voltage reference circuits for analog to digital converter circuits for analog multiplier circuits, voltage to frequency converters, etc. Heating element 16 may have the configuration of either of the devices shown in FIGS. 2A and 2B. (It should be noted that it is not necessary that heating element 16 completely surround temperature sensitive circuitry; the only requirement is that the heating element heat the temperature sensitive circuitry to a suitable predetermined temperature within an acceptably short time period.) Power is supplied to heating element 16 via conductors 70 and 71, which are connected to bonding pads 28 and 69, respectively. Power is supplied to operate temperature sensitive circuitry 12 by means of the conductors therefrom to bonding pads 72 and 73. Thin film resistor 92, which may be trimmed to compensate thermal drift of temperature sensitive circuitry 12, is connected to temperature sensitive circuitry 12 by means of conductors 93 and 94. A temperature sensitive electrical parameter subject to thermal drift is conducted by means of conductor 74 from temperature sensitive circuitry 12 to test circuit 80, which measures the temperature sensitive electrical parameter after temperature sensitive circuitry 12 reaches the above-mentioned predetermined temperature but, of course, before the integrated circuit or wafer in which the temperature sensitive circuitry is contained attains thermal equilibrium.

Test circuit 80 includes circuitry for measuring the temperature sensitive electrical parameter and generating a signal representative of the temperature sensitive electrical parameter on conductor 81. (The term "signal", as used herein and in accord with conventional useage, refers to either an analog or a digital signal; if the term as used represents a digital signal, it may refer to a digital word. In other words, if an analog signal is converted to an eight bit word representative of the same information, the term "signal" may be used to refer to the eight bit word). Test circuit 80 may perform a comparison between the temperature sensitive electrical parameter and a reference and produce a corresponding error signal on conductor 81. Or, test circuit 80 may produce a signal on conductor 81 representative of the temperature sensitive electrical parameter itself. Those skilled in the art of testing semiconductor circuits may readily implement test circuit 80 by means of various voltage measuring devices, current measuring devices, frequency measuring devices, amplifiers, comparators, counters, and a wide variety of other electronic testing equipment which are readily commercially available or easily constructed, depending on the nature of the temperature sensitive parameter.

The output of test circuit 80 is provided as an input to analog to digital converter 83 if the signal on conductor 81 is an analog signal. (However, if the signal on conductor 81 is, for example, a serial digital signal, a digital serial to parallel converter would be utilized instead.) The digital output of analog to digital converter 83 is provided as data input to processor 87. Analog to digital converter 83 may be implemented utilizing various widely commercial available devices. For example, a Burr-Brown ADC 100 could readily be utilized. If a parallel to serial converter is required to interface between test circuit 80 and processor 87, commercially available shift registers could readily be utilized to accomplish this function.

Processor 87 receives digital information from converter 83 in digital from data bus 85. The received digital information may represent the actual measured values of the temperature sensitive electrical parameter at number of different temperatures produced by heating element 16, or it may represent an error signal which represents the above-mentioned difference between the measured value of the temperature sensitive parameter and a reference value. In either case, processor or computer 87 "calls up" an appropriate subroutine which refers to stored empirical data or makes calculations from stored equations to produce laser control signals which cause laser apparatus 89 to perform the necessary amount of trimming of thin film resistor 92 to compensate the thermal drift of the temperature sensitive parameter of temperature sensitive circuitry 12. The amount of trimming required may be determined by processor 87 from a single set of measurements of the temperature sensitive parameter, or the thermal drift may be repeatedly determined during the trimming operation until the desired compensation is attained.

The digital control signals are transmitted to laser and control unit 89 by means of data bus 88. (Those skilled in the art will recognize that data buses 85 and 88 in FIG. 5 may both be implemented by a bidirectional data bus which is utilized by certain processors; the schematic drawing of FIG. 5 tends to emphasize functional signal flow rather than hardware details.) Processor 87 may be readily implemented utilizing commercially available minicomputers, such as the PDP 11 manufactured by Digital Electronics Corporation, or by commercially available microprocessors such as the Motorola MC 6800, or the Intel 8080A. Commercially available random access memories, read only memories, and electrically alterable read only memories as well as interface adaptors may be readily combined by those skilled in the art to implement processor 87 such that it may perform the above-described functions. The empirical data or equations referred to may be obtained by experimental measurements on units essentially identical to those under test. The results may then be used to produce the control information required for automated laser trimming of the units under test.

Laser and control unit 89 may be implemented utilizing readily available laser trimming machines, which include control circuitry for receiving digital inputs from a computer and producing control signals to control the laser beam and/or the X-Y movement of the unit having the trimmable resistor. One type of laser and control system provides automatic control of the laser beam (which is represented in FIG. 5 by the dotted line 90) in response to control signals from processor 87. The laser beam is precisely deflected across thin film resistor 92 to produce trimming cut 96 utilizing a mirror system whereby the laser beam 90 is controlled in response to the processor output signals. A Teradyne Model No. W311 Laser Trimming System may readily be utilized to implement laser and control unit 89 of FIG. 5 if automatic laser control is desired.

Another approach is to utilize a manually controlled laser, wherein the semiconductor device 67 is positioned on an adjustable stage of laser apparatus 89 in the path of the laser beam; the X and Y coordinates of the adjustable stage are manually adjusted by an operator to produce trimming cut 96 in thin film resistor 92, thereby compensating the thermal drift of temperature sensitive circuitry 12. The testing of the electrically sensitive parameter may be continually performed as the manual trimming operation is carried out, until the desired value of the test parameter is achieved. Of course, for the above-described manual system processor 87 and converter 83 are not required. A commercially available manual trimming laser such as the Control Laser Model 510 may be readily utilized if a manual system is required.

Figure 6:
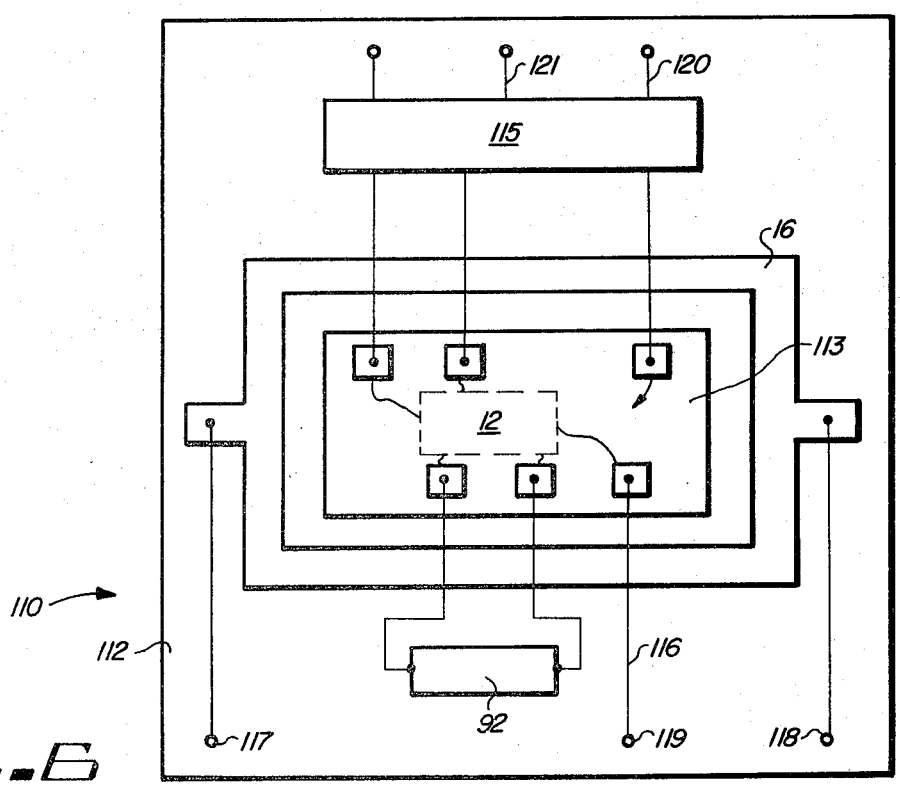
FIG. 6 shows a schematic diagram of a hybrid integrated circuit including a thick film resistive heating element surrounding temperature sensitive circuitry.

In another embodiment of the invention, in a hybrid integrated circuit, heating element 16 is provided in the form of a thick film resistor disposed on a ceramic substrate around a temperature sensitive semiconductor circuit which is also disposed on the ceramic substrate. In FIG. 6, monolithic integrated circuit chip 113 includes temperature sensitive circuitry 12, surrounded by thick film resistor 116 on ceramic substrast 112. Power is applied to heating element 16 by means of conductors connecting opposed ends of the heating element to pins 117 and 118, which extend through apertures in the ceramic substrate. The hybrid assembly may then be plugged into a socket or a PC board by means of such pins. The trimmable element in FIG. 6 is thick film resistor 92, which is connected to bonding pads which are in turn connected to temperature sensitive circuitry 12. Other semiconductor circuits, such as 115 may also be included on ceramic substrate 12. (The hybrid integrated circuit technology is well known, and therefore the precise details thereof are not shown in FIG. 6, or described herein).

In one mode of practicing the invention, the operating power for the temperature sensitive circuitry and the heating power for the heating element are applied in the same instant. Since there is a thermal time constant associated with the "warming up" of heating element 16 and temperature sensitive circuitry 12, the rate of change of the temperature sensitive parameter with respect to the time (i.e., $\Delta V/\Delta T$, where V is the temperature sensitive parameter and T is the temperature of the temperature sensitive circuitry 12) may be determined by the apparatus of FIG. 5 by making measurements of the temperature sensitive parameter at the beginning and end of the time interval $\Delta T$. The rate of change of temperature of the temperature sensitive circuitry with respect to time (i.e., $\Delta T/\Delta t$) may be previously empirically determined for the particular configuration of the heating element, the temperature sensitive circuitry of the semiconductor device, and of the testing and trimming apparatus elements, all of which affect heat conduction in the device under test. Consequently, the thermal drift, which is the rate of change of the temperature sensitive parameter V with respect to temperature T (i.e., $\Delta V/\Delta T$) may be determined. Information representative of the thermal drift may then be utilized (in digital form) by the processor to select information representative of the precise amount of trimming required for the thin film compensating resistor from empirical data stored in the processor. Alternatively, the drift information may be utilized by an operator to determine the amount of trimming required from empirical data in the form of curves of graphs.

It should be noted that the above mentioned rate of change of temperature with respect to time (i.e., $\Delta T/\Delta t$) of the temperature sensitive circuitry 12 may also be and thereby nerified by separate experiments. For example, the variation in the temperature sensitive parameter V for a one second period may be determined using the apparatus of FIG. 5. The monolithic semiconductor chip 67 may then be packaged and, utilizing classical techniques in which an oven is utilized to establish thermal equilibrium prior to each measurement, the temperature sensitive parameter V may be measured over specified temperature range. The rate of temperature change of the thermally sensitive circuitry with respect to time may then be determined.

I claim:
1. A monolithic integrated circuit chip including temperature sensitive circuitry located in a relatively small portion of said integrated circuit, said integrated circuit comprising in combination:
  (a) a heating resistor substantially surrounding said temperature sensitive circuitry for heating said temperature sensitive circuitry in response to an electrical signal being applied to the heating resistor, said heating resistor being sufficiently close to said temperature sensitive circuitry to cause said heating resistor to heat said temperature sensitive circuitry to a predetermined temperature substantially more rapidly than thermal equilibrium is attained in remaining portions of the integrated circuit chip;
  (b) first bonding means connected to one electrode of said heating resistor for conducting said electrical signal to said heating resistor;
  (c) a trimmable element determinative of the thermal drift of a temperature sensitive electrical parameter of said temperature sensitive circuitry, whereby said trimmable element may be trimmed to compensate the thermal drift in response to a measurement of the temperature sensitive parameter when said heating resistor is utilized to heat the temperature sensitive circuitry; and
  (d) means in said temperature sensitive circuitry for effecting measuring of said temperature sensitive parameter after said temperature sensitive circuitry has risen to said predetermined temperature and substantially before thermal equilibrium is established in said remaining portions of the integrated circuit;
whereby said resistive heating means can be energized to rapidly heat said temperature sensitive circuitry to said first temperature and immediately measure said temperature sensitive parameter while said integrated circuit is in a wafer without the necessity of waiting for portions of the wafer more remote from said resistive heating means than said temperature sensitive circuitry to be heated to said predetermined temperature.

2. The integrated circuit of claim 1 further including means for supplying operating power to said temperature sensitive circuitry and to said trimmable element.

3. The integrated circuit of claim 2 wherein said trimmable element comprises a thin film resistor and said electrical signal supplying means includes conductors connected to two respective end-points of said thin film resistor, and wherein said integrated circuit further includes first and second bonding pads connected, respectively, to the first and second ones of said conductors.

4. The integrated circuit of claim 3 wherein said heating resistor includes a doped semiconductor region substantially surrounding said temperature sensitive circuitry.

5. The integrated circuit of claim 3 wherein said heating resistor includes a thin film resistor substantially surrounding said temperature sensitive c 6. The integrated circuit of claim 3 wherein said integrated circuit is a hybrid integrated circuit including a monolithic integrated circuit chip thereon, and wherein said heating resistor includes a thick film resistor disposed on the substrate of said hybrid integrated circuit and surrounding said monolithic integrated circuit chip.

7. The integrated circuit of claim 3 wherein said temperature sensitive circuitry includes first and second junction field effect transistors connected as input transistors of a differential amplifier, and wherein said trimmable element is coupled to one of said junction field effect input transistors to compensate for thermal drift caused by variances in electrical characteristics of the first and second junction field effect transistors.

* * * * *